United States Patent [19]

Stein

[11] Patent Number: 5,382,822
[45] Date of Patent: Jan. 17, 1995

[54] METAL-INSULATOR SEMICONDUCTOR FIELD-EFFECT TRANSISTOR

[75] Inventor: René Stein, Roettenbach, Germany

[73] Assignee: Siemens Aktiengesellschaft, Munich, Germany

[21] Appl. No.: 127,861

[22] Filed: Sep. 27, 1993

[30] Foreign Application Priority Data

Sep. 25, 1992 [DE] Germany .............................. 4232248
Sep. 25, 1992 [DE] Germany .............................. 4232249

[51] Int. Cl.$^6$ .................... H01L 29/78; H01L 29/161
[52] U.S. Cl. ........................................ 257/410; 257/76; 257/77; 257/613; 257/615
[58] Field of Search ............... 257/410, 77, 629, 76, 257/613, 615

[56] References Cited

U.S. PATENT DOCUMENTS 5,087,959  2/1992  Omori et al. ........................... 357/54
5,107,315  4/1992  Kumagai et al. ...................... 257/410

FOREIGN PATENT DOCUMENTS 0145134  8/1983  Japan ...................... 257/77

OTHER PUBLICATIONS

J. Appl. Phys., vol. 64, No. 4, 15 Aug. 1988, pp. 2168-2177, J. W. Palmour et al.: *Characterization of device parameters in high-temperature metal-oxide-semiconductor-field-effect transistors in β-SIC thin films.*

Materials Science and Engineering, B11, 1992, pp. 257-263, Alan T. Collins:*Diamond electronic devices —can they outperform silicon or GaAs?.*

MAT. RES. SOC. SYMP. PROC., vol. 162, 1990, Materials Research Society, pp. 15-22, M. W. Geis: *Growth of Device-Quality Homoepitaxial Diamond Thin Films.*

Primary Examiner—Mark V. Prenty
Attorney, Agent, or Firm—Kenyon & Kenyon

[57] ABSTRACT

A MISFET (metal-insulator semiconductor field-effect transistor) may be used for application at temperatures above 200° C. In particular, leakage currents between the gate electrode (6) and the drain (8) are kept at a low level, and a considerable rate of rise in its control characteristic is achieved. An insulating layer (4) of diamond is arranged between the gate electrode (6) and a semiconductor (2) having a larger energy gap than silicon (Si).

3 Claims, 1 Drawing Sheet

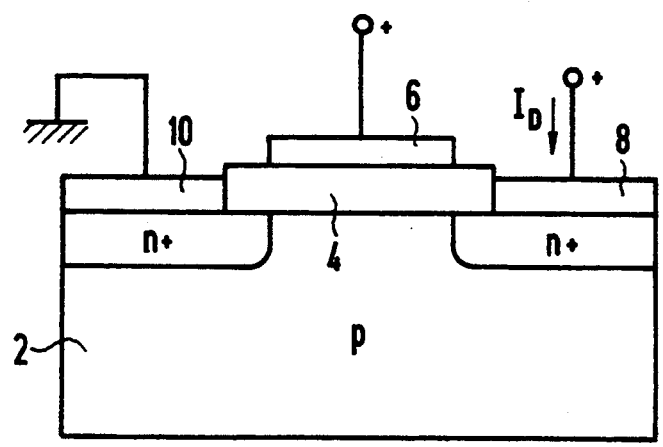

METAL-INSULATOR SEMICONDUCTOR FIELD-EFFECT TRANSISTOR

BACKGROUND OF THE INVENTION

The present invention relates to a metal-insulator semiconductor field-effect transistor (MISFET).

Field-effect transistors (FET) are semiconductor components having three connections, namely a source connection, a drain connection and a gate electrode. The current flowing between the source and the drain is controlled by applying an electric field to the gate electrode in a direction perpendicular to the current flow. The field results in enhancement or depletion of the carriers and, thus, changes the size of a channel which conducts current in the semiconductor. When no control voltage is being fed to the gate electrode, this channel is either open (normally on) or closed (normally off).

There are three basic types of FETs, including:
- MESFET (MES=metal semiconductor), in which the gate electrode is arranged directly on the semiconductor;
- JFET (J=junction), in which a p-n junction is arranged between the gate electrode and the conductive channel; and
- MISFET (MIS=metal-insulator semiconductor), in which an insulating layer is arranged between the gate electrode and the semiconductor.

MOSFET (MOS=metal-oxide semiconductor) constitutes a special type of the last-mentioned MISFET type. In the case of the MOSFET, the insulating layer consists of an oxide of the semiconductor. FET and, in particular, MISFET are manufactured primarily with silicon (Si). However, silicon is no longer functional at temperatures over 200° C. due to its relatively small energy gap between the valence band and the conduction band of 1.1 eV.

Silicon carbide (SiC) is known as a material for electronic high-temperature components. Its electronic properties make it possible for SiC to be used at temperatures of up to about 1300 K. The special advantages the semiconductor material SiC has over the elementary semiconductor Si are, besides its larger band gap of between 2.2 eV and 3.4 eV, in accordance with the polytype used, compared to 1.1 eV for silicon, its breakdown dielectric strength of about $4 \times 10^6$ V/cm, which is higher by a factor of 13, the three times greater thermal conductivity, and the saturation drift velocity that is greater by a factor of 2.3.

A MOSFET having a SiC basis is known, in which a thin p-conductive SiC film is deposited on a p-conductive 6H-SiC substrate. Two more heavily doped n+ regions are arranged as a source and, in between, an n+ region as a drain on the surface of the n-SiC film. These n+ regions are contacted with corresponding electrodes consisting of $TaSi_2$. A gate electrode of polycrystalline silicon is arranged in each case between the two source regions and the drain region. Disposed in each case between these gate electrodes and the n-SiC film is an oxide layer of $SiO_2$, which also insulates the corresponding gate electrode from the other electrodes. This oxide layer can be produced relatively simply through the thermal oxidation of the SiC layer (J. Appl. Phys., Vol. 64, No. 4, Aug. 15, 1988, pp. 2168–2177). To produce an inversion layer in the case of such a SiC MOSFET, the gate electrode must be fed higher gate voltages than in the case of a comparable Si MOSFET, due to the larger energy gap of SiC compared to Si. However, the breakdown dielectric strength of $SiO_2$ lies merely at about $3 \times 10^6$ V/cm. Given a gate voltage of, for example, 50 V, one must select such a thick $SiO_2$ layer that the channel can no longer be controlled, because of the smaller capacitance associated with such a layer. A further disadvantage of $SiO_2$ is its increasing ionic conductivity at higher temperatures. In the high-temperature range above 200° C., leakage currents arise, therefore, between the gate and drain in the case of the described MOS structure, which adversely affect the functioning of the MOSFET.

Generally, all semiconductors having a correspondingly greater energy gap than Si come under consideration for use in the high-temperature range. Examples are: gallium arsenide (GaAs) having an energy gap of 1.4 eV, gallium phosphide (GaP) having 2.3 eV, gallium nitride (GaN) having 3.4 eV., aluminum phosphide (AlP) having 3.12 eV, aluminum nitride (AlN) having 6.2 eV, or boron nitride (BN) having 7.5 eV (in each case at 300 K.). Contrary to SiC, these materials do not form any naturally occurring oxide, which could be produced through thermal oxidation. A $SiO_2$ insulating layer for a MISFET on the basis of these semiconductors would, therefore, have to be deposited, for example, using sputtering techniques. The insulating properties of a $SiO_2$ layer produced in this manner, however, are generally even worse than those of a thermally grown $SiO_2$ layer.

SUMMARY OF THE INVENTION

The present invention specifies a MISFET on the basis of a semiconductor having a larger energy gap than Si, in the case of which even at high temperatures of over 200° C., leakage currents between the gate and the drain can be kept at a low level and, in addition to this, a considerable rate of rise is achieved for the control characteristic.

According to the present invention, a layer of diamond is provided as an insulating layer between the gate electrode and the semiconductor. Diamond is very heat resistant and has about a 3.3 times higher breakdown dielectric strength, as well as about a 1.5 times higher relative dielectric constant than $SiO_2$. Furthermore, even at higher temperatures, no ionic conduction occurs in diamond. By using diamond for the insulating layer of the MISFET, the rate of rise of the control characteristic can be increased in comparison to $SiO_2$ and, in addition, the leakage currents in the insulating layer can be considerably reduced.

BRIEF DESCRIPTION OF THE DRAWING

Other features and advantages of the present invention will become apparent from the following written description taken in conjunction with the attached drawing.

The FIGURE illustrates an n-channel, normally-off specific embodiment of a MISFET according to an embodiment of the present invention.

It is understood that other embodiments of MISFETs as for example V-MOS FET, D-MOS FET or other as are well known to those skilled in the art can be used according to the invention.

DETAILED DESCRIPTION

In the only Figure of the drawing, an n-channel, normally-off specific embodiment of a MISFET in accordance with the present invention is schematically depicted including a semiconductor 2 having a larger energy gap than silicon, an insulating layer of diamond 4, a gate electrode 6, a drain 8, and a source 10. Diamond insulating layer 4 is arranged between gate electrode 6 and semiconductor layer 2.

The present invention specifies a MISFET on the basis of a semiconductor having a larger energy gap than Si, in the case of which even at high temperatures of over 200° C., leakage currents between the gate and the drain can be kept at a low level and, in addition to this, a considerable rate of rise is achieved for the control characteristic.

According to the present invention, a layer of diamond is provided as an insulating layer between the gate electrode and the semiconductor. Diamond is very heat resistant and has about a 3.3 times higher breakdown dielectric strength, as well as about a 1.5 times higher relative dielectric constant than $SiO_2$. Furthermore, even at higher temperatures, no ionic conduction occurs in diamond. By using diamond for the insulating layer of the MISFET, the rate of rise of the control characteristic can be increased in comparison to $SiO_2$ and, in addition, the leakage currents in the insulating layer can be considerably reduced.

The intrinsic charge carrier density $n_i$ in diamond is given in dependence upon the temperature T by the relation $$n_i(T) = 2(2m^* kT\, Pi/h^2)^{1.5} \exp(-E_G/2kT),$$

k being the Boltzmann constant, h Planck's constant of action, $E_G$ the energy gap between the valence band and the conduction band, and $m^*$ the effective mass of the charge carriers. The specific resistance of intrinsic diamond is given by $(en_i\mu)^{-1}$, with the elementary charge e and the mobility $\mu$ of the charge carriers, which depends approximately in the following way on the temperature in Kelvin (K):

$$\mu(T) = 2200(T/290)^{-2.9}$$

(Material Science and Engineering, B 11, 1992, pp. 257-263).

At a temperature of 1300° K. (or about 1027° C.), a charge carrier density $n_i$ of about $10^{10}$ cm$^{-3}$ results, for example, and a specific resistance of about $3 \times 10^7$ ohm cm. Given a 1 μm thick diamond layer with an applied gate voltage of 10 V, the leakage current has a negligible value of about 3 μA.

Using diamond for the insulating layer has two immediate advantageous effects on the control properties of the MISFET. On the one hand, the breakdown field strength of diamond is at least about $10^7$ V/cm (Mat. Res. Soc. Symp. Proc., Vol. 162, 1990, pp. 15-22). On the other hand, at 5.7, the relative dielectric constant of diamond is clearly greater than the relative dielectric constant 3.9 of $SiO_2$ (Materials Science and Engineering, loc. cit.). Thus, given an insulating layer of the same thickness, gate voltages that are higher by a factor of 3.3 compared to a $SiO_2$ layer can be applied to the diamond layer, due to the higher breakdown field strength, since the gate voltage is essentially equal to the product of the thickness and applied field strength. Conversely, given the same gate voltage, the thickness of the insulating layer can be considerably reduced. Moreover, due to the higher relative dielectric constant, the capacitance of the insulating layer of diamond is higher, given the same thickness, by a factor of 1.5 than the capacitance of an $SiO_2$ layer. The capacitance is proportional to the quotient of the relative dielectric constant and the thickness of the layer. At this point, however, the rate of rise of the control characteristic of the MISFET is also determined by the capacitance. The source-drain current $I_D$ is, namely, essentially proportional to the product of the capacitance of the insulating layer and the gate voltage. Consequently, therefore, due to the smaller, selectable thickness of the insulating layer of diamond and its higher relative dielectric constant, the rate of rise of the control characteristic can be increased by a factor of about 4.8.

The thickness of the diamond layer is generally selected to be between 0.001 μm and 10 μm and, in particular, between 0.01 μm and 2 μm.

In principle, all known methods can be used for manufacturing the diamond layer for the MISFET. A survey of these known methods can be found in Proceedings of the IEEE, Vol. 79, No. 5, May 1991, pp. 621-646. The diamond layer is preferably precipitated out of the gaseous phase on to the semiconductor substrate. The structuring can be produced, for example, through selective deposition with the aid of a mask of silicon dioxide or also by etching a diamond layer, which had initially been precipitated over the entire surface, in the oxygen plasma with the aid of known lithographic methods.

One preferred specific embodiment foresees using SiC as a semiconductor, preferably in the 3 C-, 4 H- and 6 H-polytypes.

In one preferred specific embodiment, the MISFET is coated with a flashover-protection layer of diamond to protect it from electric flashovers between the MISFET and its surroundings.

As the result of its large energy gap of 5.4 eV at 300 K., at high temperatures of over 200° C. (=473 K.), diamond still has excellent insulating properties.

What is claimed is:

1. A metal-insulator semiconductor field-effect transistor comprising:
    a gate electrode;
    a semiconductor; and
    an insulating layer of diamond arranged between the gate electrode and the semiconductor;
    wherein a material from the group of the following materials is provided as the semiconductor: gallium phosphide (GaP), gallium arsenide (GaAs), gallium nitride (GaN), aluminum nitride (AlN), an aluminum phosphide (AlP), boron nitride (BN), and silicon carbide (SiC).

2. The metal-insulator semiconductor field-effect transistor according to claim 1, wherein a thickness of the insulating layer of diamond is selected to be between 0.001 μm and 10 μm.

3. The metal-insulator semiconductor field-effect transistor according to claim 1, wherein a thickness of the insulating layer of diamond is selected to be between 0.01 μm and 2 μm.

* * * * *